(12) United States Patent
Nishikawa et al.

(10) Patent No.: US 7,508,292 B2
(45) Date of Patent: Mar. 24, 2009

(54) COIL COMPONENT

(75) Inventors: Tomonaga Nishikawa, Tokyo (JP);
Tomokazu Ito, Tokyo (JP); Makoto Yoshida, Tokyo (JP); Hiroshi Kamiyama, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 11/979,445

(22) Filed: Nov. 2, 2007

(65) Prior Publication Data
US 2008/0129439 A1 Jun. 5, 2008

(30) Foreign Application Priority Data
Nov. 30, 2006 (JP) ............... 2006-323712

(51) Int. Cl.
*H01F 5/00* (2006.01)
(52) U.S. Cl. ............... 336/200; 336/223; 336/232
(58) Field of Classification Search ............... 336/200, 336/223, 232
See application file for complete search history.

(56) References Cited
U.S. PATENT DOCUMENTS

| | | | |
|---|---|---|---|
| 6,618,929 B2 * | 9/2003 | Kitamura | 29/602.1 |
| 6,710,694 B2 * | 3/2004 | Matsuta et al. | 336/200 |
| 7,064,629 B2 | 6/2006 | Shoji | |
| 7,382,222 B1 * | 6/2008 | Manetakis | 336/200 |
| 2005/0253677 A1 * | 11/2005 | Ito et al. | 336/200 |

FOREIGN PATENT DOCUMENTS

| | | |
|---|---|---|
| JP | A-58-113 | 1/1983 |
| JP | A-2002-203718 | 7/2002 |
| JP | A-2004-95860 | 3/2004 |
| JP | B2-3601619 | 12/2004 |
| JP | A-2005-159223 | 6/2005 |

* cited by examiner

*Primary Examiner*—Anh T Mai
(74) *Attorney, Agent, or Firm*—Oliff & Berridge, PLC (57) ABSTRACT

The invention relates to surface-mount type coil components having a mounting surface for mounting them on a printed circuit board or hybrid IC (HIC) and provides a coil component having high electrical characteristics. A common mode filter includes a coil conductor formed in a spiral shape, cut ends which are parts of the coil conductor cut to face each other, and bridge conductors formed so that an insulation film is interposed between the coil conductor and the same to connect the cut ends to each other.

7 Claims, 7 Drawing Sheets

COIL COMPONENT

BACKGROUND OF THE INVENTION

1. Field of the Invention

The present invention relates to a surface-mount type coil component having a mount surface for mounting the same on a printed circuit board or a hybrid IC (HIC).

2. Description of the Related Art

Known coil components mounted on circuits in electronic apparatus such as personal computers and cellular phones include wire-wound type components provided by winding a copper wire around a ferrite core, multi-layer type components provided by forming a coil conductor pattern on a surface of a magnetic sheet made of ferrite and stacking such magnetic sheets one over another, and thin-film type components provided by forming insulation films and coil conductors constituted by metal thin films alternately using thin film forming techniques. Multi-layer type and thin-film type coil components can be easily provided with a small size.

Known coil components include common mode filters for suppressing a common mode current which can cause electromagnetic interference in a balanced transmission system. Patent Document 1 discloses a common mode choke coil (common mode filter) provided by stacking a first insulator layer, two lead-out electrodes, a second insulator layer, a first coil conductor, a third insulator layer, a second coil conductor, and a fourth insulator layer in the order listed on a surface of a magnetic substrate.

One of the two lead-out electrodes is put in contact and electrical connection with an inner circumferential end of the first coil conductor through a via hole provided on the second insulator layer, and the other lead-out electrode is put in contact and electrical connection with an inner circumferential end of the second coil conductor through via holes provided on the second and third insulator layers. The regions for connecting the coil conductors and the lead-out electrodes are formed inside the coil conductors when viewed in the normal direction of a substrate surface of the magnetic substrate. Therefore, the via holes are formed inside the coil conductors when viewed in the normal direction of the substrate surface.

In many common mode filters, insulator layers inside two coil conductors are removed to form an opening, and a magnetic layer is formed so as to fill the opening in order to improve the degree of mutual magnetic coupling between the two coil conductors and to improve impedance characteristics by increasing common mode impedance.

Recently, there is demand for reduction in the size of common mode filters for use in small electronic apparatus such as cellular phones. Reduction in the size of common mode filters results in a need for reducing areas occupied by via holes. Via holes are frequently formed using a photolithographic process to form the holes with a very small size.

However, via holes are formed greater than the width of coil conductors in most cases for the purpose of improving the reliability of connection between coil conductors and lead-out electrodes and because of photolithographic conditions such as the resolution of photosensitive resin used as insulator layers in which the via holes are formed. In the case of a common mode filter disclosed in Patent Document 1, connecting regions for inter-layer connection between coil conductors and lead-out electrodes must be provided inside the coil conductors, and a part of regions for forming coil conductors and magnetic layers must be spared for the provision of via hole regions. Thus, connecting regions must be provided separately from the region where coil conductors and magnetic layers are formed. As a result, limitations are placed on attempts to increase the number of turns of a coil conductor or the surface area of a magnetic layer, and it is therefore difficult to obtain a common mode filter having high impedance. A problem therefore arises in that it is difficult to obtain a common mode filter which is excellent in electric characteristics such as impedance characteristics.

Patent Document 2 discloses a thin-film common mode filter provided by stacking a first insulator layer, a lower lead conductor, a second insulator layer, a lower coil conductor, a third insulator layer, an upper coil conductor, a fourth insulator layer, an upper lead conductor, and a fifth insulator layer in the order listed, on an insulated magnetic substrate. One end of the lower lead conductor is electrically connected to an end of the lower coil conductor at the center thereof through a through hole formed in the second insulator layer. One end of the upper lead conductor is electrically connected to an end of the upper coil conductor at the center thereof through a through hole formed in the fourth insulator layer. An insulated magnetic element is formed inside the two coil conductors to provide a return part in a magnetic path in the middle of the coils.

As apparent from above, it is also required in the thin-film common mode filter disclosed in Patent Document 2 to connect coil conductors and lead conductors at the centers of the coil conductors. Therefore, the above-described problem is also encountered in the thin-film common mode filter disclosed in Patent Document 2. The above-described problem occurs not only in common mode filters but also in other multi-layer type and thin-film type coil components having spiral coil conductors such as inductors and transformers.

Patent Document 1: Japanese Patent No. 3601619

Patent Document 2: JP-A-2005-159223

SUMMARY OF THE INVENTION

It is an object of the invention to provide a coil component having high electrical characteristics.

(1) The above-described object is achieved by a coil component including a first coil conductor formed in a spiral shape, first cut ends which are parts of the first coil conductor cut to face each other, and a first connecting conductor formed so that an insulation film is interposed between the first coil conductor and the same to connect the first cut ends to each other.

(2) The invention provides the coil component according to the item (1), wherein a width of an inner circumferential end of the first coil conductor is equal to or smaller than a width of the first coil conductor.

(3) The invention provides the coil component according to the item (1), wherein it further includes a first lead-out electrode formed in the same layer as the first coil conductor formed therein and extend from the inner circumferential end of the first coil conductor through a gap between the first cut ends up to the outside of the first coil conductor.

(4) The invention provides the coil component according to the item (1), wherein the first lead-out conductor extends in the form of a straight line.

(5) The invention provides the coil component according to the item (1), wherein it further includes a magnetic layer formed inside the first coil conductor.

(6) The invention provides the coil component according to the item (1), wherein it further includes a second coil conductor formed in a spiral shape and disposed opposite to the first coil conductor, second cut ends which are parts of the second coil conductor cut to face each other, and a second connecting conductor formed so that an insulation film is interposed between the second coil conductor and the same to connect the second cut ends to each other.

(7) The invention provides the coil component according to the item (6), wherein the second connecting conductor is formed in the same layer as the first connecting conductor formed therein and the first and the second connecting conductors are formed between the first and the second coil conductors.

The invention makes it possible to provide a coil component having high electrical characteristics.

DESCRIPTION OF PREFERRED EMBODIMENT

Figure 1:
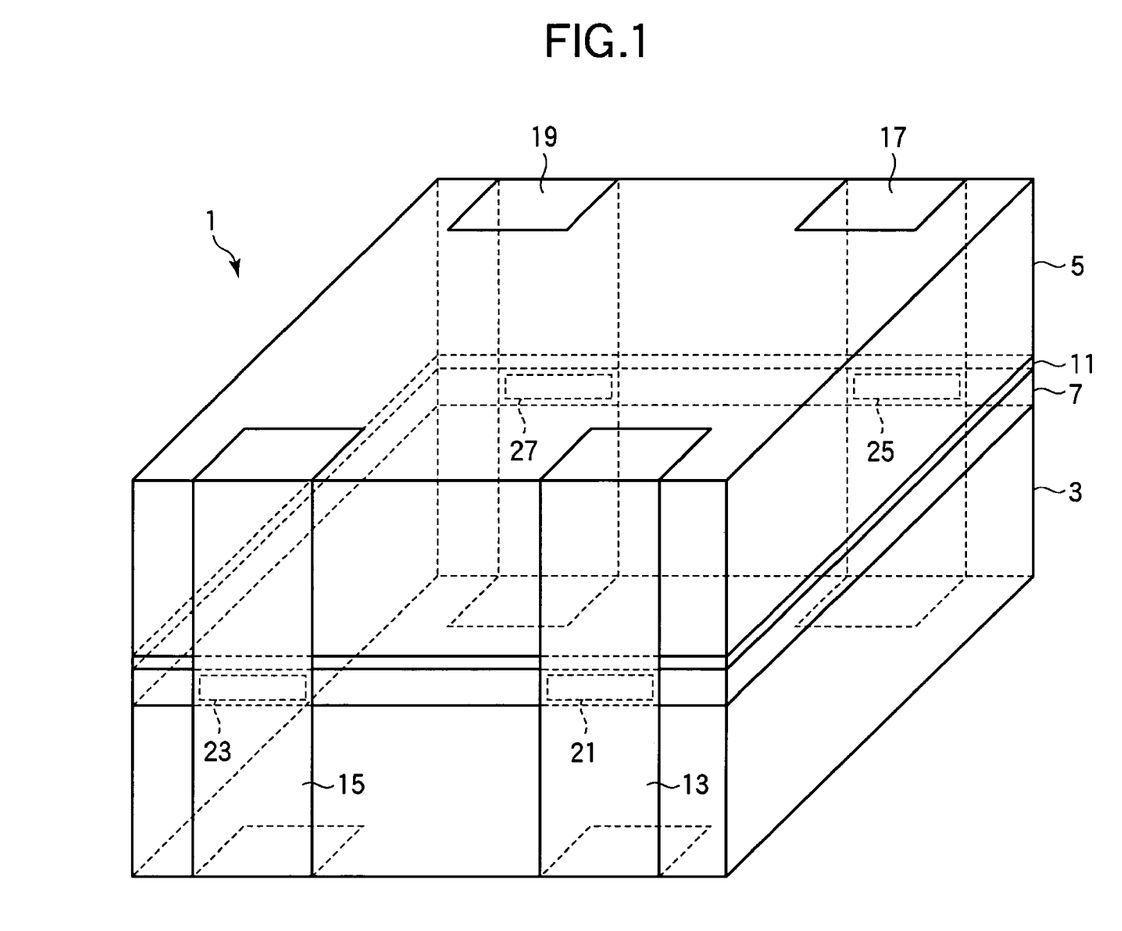
FIG. 1 is a perspective view of a common mode filter 1 according to an embodiment of the invention.

A coil component that is an embodiment of the invention will now be described with reference to FIGS. 1 to 7. A common mode filter for suppressing a common mode current which can cause electrostatic interference in a balanced transmission system will be described as an example of a coil component of the present embodiment. FIG. 1 is a perspective view of a common mode filter 1. In FIG. 1, hidden lines are indicated by broken lines.

As shown in FIG. 1, the common mode filter 1 has a rectangular parallelepiped outline which is formed by stacking thin films between two magnetic substrates 3 and 5 in the form of thin rectangular parallelepiped plates disposed to face each other. The common mode filter 1 is what is called a 1005-type surface-mount component (whose longer sides are 1.0 mm long and whose shorter sides are 0.5 mm long). An insulation layer 7 and a bonding layer 11 are formed in the order listed between the magnetic substrates 3 and 5 using thin-film forming techniques. Internal electrode terminals 21, 23, 25, and 27 are formed in the vicinity of side surfaces of the insulation layer 7 such that they are exposed on the side surfaces of the insulation layer 7. The internal electrode terminals 21 and 23 are exposed on one side surface, and the internal electrode terminals 25 and 27 are exposed on the side surface opposite to that side surface. The internal electrode terminal 21 is disposed opposite to the internal electrode terminal 25, and the internal electrode terminal 23 is disposed opposite to the internal electrode terminal 27.

Figure 2:
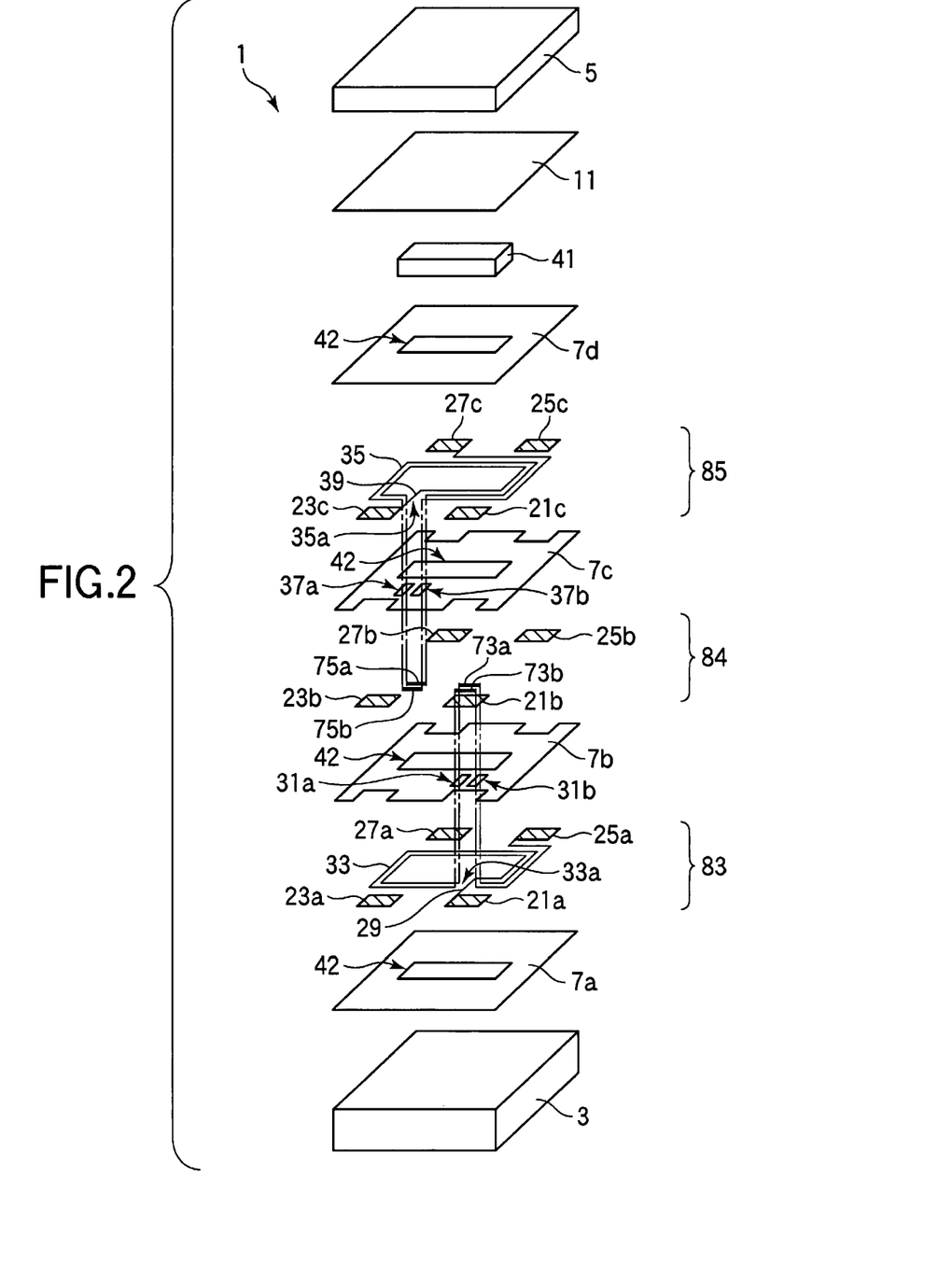
FIG. 2 is an exploded perspective view of the common mode filter 1 according to the embodiment of the invention.

An external electrode 13 is formed to extend on the side surface where the internal electrode terminal 21 is exposed and on mounting surfaces of the magnetic substrates 3 and 5. External electrodes 15, 17, and 19 are formed in the same shape as the external electrode 13. The external electrodes 13, 15, 17, and 19 are electrically connected to the internal electrode terminals 21, 23, 25, and 27 exposed on the side surfaces, respectively, FIG. 2 is an exploded perspective view of the common mode filter 1 showing a multi-layer structure of the same. FIG. 2 omits the external electrodes 13, 15, 17, and 19. In FIG. 2, connection between conductors formed in different layers is represented by a chain line. As shown in FIG. 2, an insulation film 7a, a coil conductor layer 83, an insulation film 7b, a bridge conductor layer 84, an insulation film 7c, a coil conductor layer 85, an insulation film 7d, and a bonding layer 11 are stacked in the order listed between the magnetic substrates 3 and 5. The insulation layer 7 is constituted by the insulation films 7a, 7b, 7c, and 7d. The coil conductor layer 85 is disposed opposite to the coil conductor layer 83 with the insulation film 7b, the bridge conductor layer 84, and the insulation film 7c interposed between the coil conductor layers. The coil conductor layer 84 is disposed between the coil conductor layers 83 and 85 with the insulation film 7b interposed between the conductor layers 84 and 83 and the insulation film 7c interposed between the conductor layers 84 and 85.

Insulation films 7a, 7b, 7c, and 7d are partially removed to form rectangular openings 42 inside the coil conductor 33 (first coil conductor) and the coil conductor 35 (second coil conductor). In the present specification, the wording "inside the coil conductors 33 and 35" means that something is located inside the coil conductors 33 and 35 when viewed in the normal direction of substrate surfaces of the magnetic substrates 3 and 5 (hereinafter referred to as "the normal direction of the substrate surface"). The openings 42 formed in the respective insulation films 7a, 7b, 7c, and 7d are in the same position when viewed in the normal direction of the substrate surface. To improve the degree of mutual magnetic coupling between the coil conductors 33 and 35 and to improve impedance characteristics by increasing common mode impedance, a magnetic layer 41 is formed so as to fill the openings 42. The magnetic layer 41 is formed from composite ferrite obtained by mixing magnetic particles made of ferrite in a resin. For the same purpose, four parts of the insulation layer 7 at the corners thereof may be removed to form openings in those parts respectively, and magnetic layers may be formed so as to fill the openings.

Since no via hole is formed inside the coil conductors 33 and 35 of the common mode filter 1 as will be detailed later, and the magnetic layer 41 can be formed to occupy a large area in the common mode filter 1. The common mode filter 1 can therefore be provided with improved electrical characteristics such as impedance characteristics.

Figure 3:
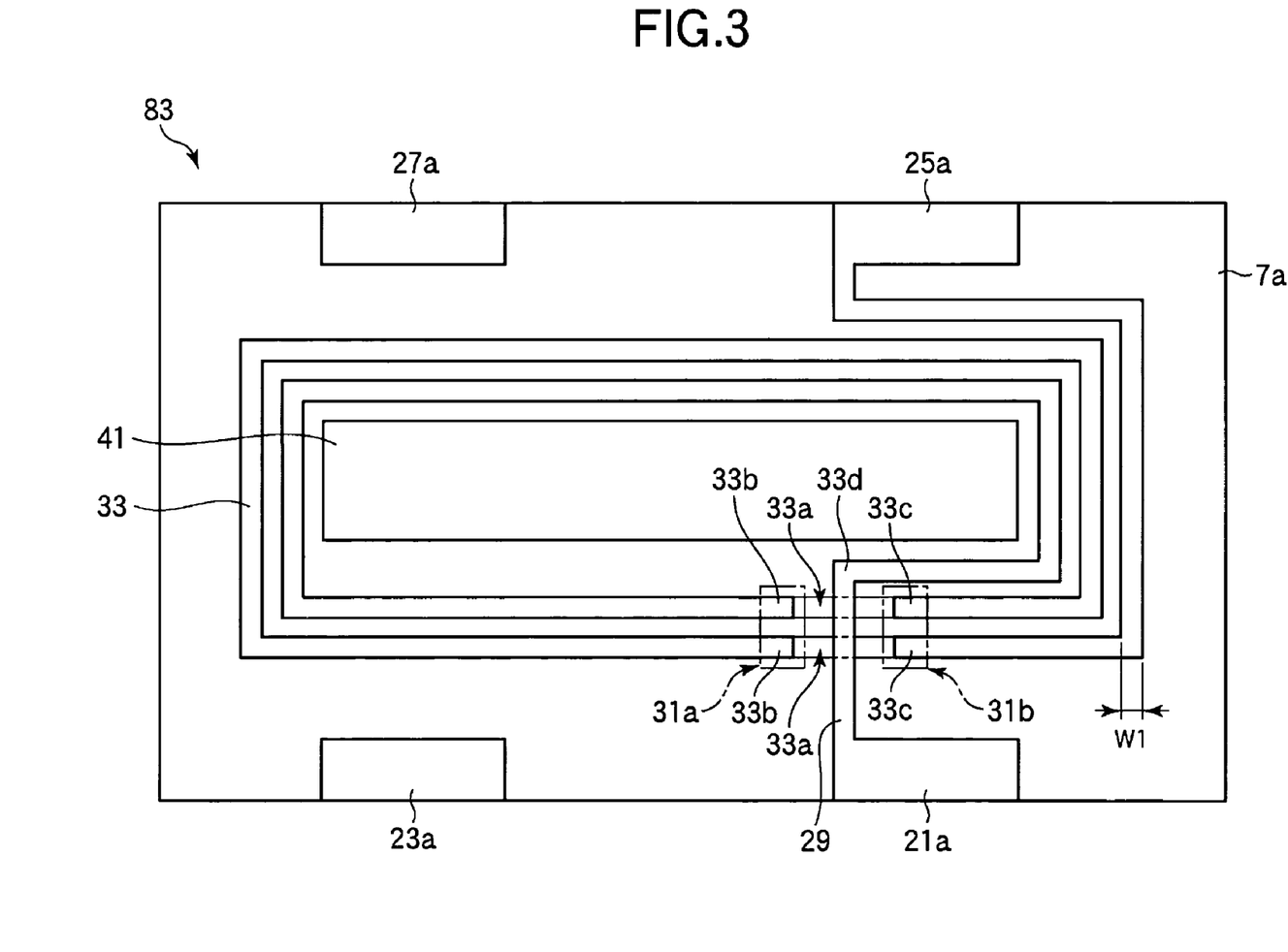
FIG. 3 shows a coil conductor layer 83 of the common mode filter 1 according to the embodiment of the invention.

FIG. 3 is a plan view of the coil conductor layer 83 taken in the normal direction of the substrate surface. In FIG. 3, an imaginary line is represented by a chain line. As shown in FIG. 3, the coil conductor layer 83 includes internal electrode terminals 21a, 23a, 25a, and 27a, a lead wire (first lead-out conductor) 29, and a coil conductor 33. The internal electrode terminals 21a, 23a, 25a, and 27a, the lead wire 29, and the coil conductor 33 are simultaneously formed in the same layer from the same material.

The coil conductor 33 is formed in a spiral shape which extends outwardly from an inner circumferential end 33d of the conductor and which is wound counterclockwise to make about 2.5 turns. An outer circumferential end of the coil conductor 33 is connected to the internal electrode terminal 25a. The coil conductor 33 has a width w1 which is, for example, in the range from 10 to 30 µm. The coil conductor 33 is partially cut in one location of each turn thereof or in two locations in total in the vicinity of the inner circumferential end 33d. Thus, the conductor has a cut portion 33a formed on each turn thereof. The two cut portions 33a formed on the respective turns are aligned in a line in the vertical direction of FIG. 3. The lengths of the two cut portions 33a are substantially equal to each other.

Cut ends (first cut ends) 33b and 33c of each turn of the coil conductor 33 face each other with the cut portion 33a interposed between them. The two cut ends 33b are formed on the left side of the cut portions 33a in the figure, and they are exposed at a via hole 31a formed in the insulation film 7b (not shown in FIG. 3). The two cut ends 33c are formed on the right side of the cut portions 33a in the figure, and they are exposed at a via hole 31b formed in the insulation film 7b.

The lead wire 29 is extended from the inner circumferential end 33d of the coil conductor 33 through the gap between the cut ends 33b and 33c up to the outside of the coil conductor 33. One end of the lead wire 29 is connected to the internal electrode terminal 21a. Another end of the lead wire 29 is connected to the inner circumferential end 33d of the coil conductor 33. Therefore, the inner circumferential end 33d of the coil conductor 33 is electrically connected to the internal electrode terminal 21a which is formed in the coil conductor layer 83 through the lead wire 29 formed in the coil conductor layer 83 in which the conductor is formed. Thus, no via hole for inter-layer connection between the coil conductor 33 and the lead wire is formed inside the coil conductors 33 and 35 when viewed in the normal direction of the substrate surface.

The lead wire 29 extends in the form of a straight line in the vertical direction of the figure. When viewed in the normal direction of the substrate surface, the lead wire 29 is substantially orthogonal to each of the two cut portions 33a. The lead wire 29 extends substantially in the middle of the gap between the cut ends 33b and 33c. The insulation film 7b is formed at each of the gaps between the lead wire 29 and the cut ends 33b and 33c. Insulation is provided at each of the gaps between the lead wire 29 and the cut ends 33b and 33c by the insulation film 7b. The lead wire 29 is not exposed at the via holes 31a and 31b.

Referring to FIG. 2 again, the bridge conductor layer 84 includes bridge conductors (first connection conductors) 73a and 73b which are formed so that the insulation film 7b is interposed between the coil conductor 33 and the same to connect the cut ends 33b and 33c to each other and bridge conductors (second connection conductors) 75a and 75b which are formed so that the insulation film 7c is interposed between the coil conductor 35 and the same to connect cut ends (second cut ends) 35b and 35c to each other. Further, the bridge conductor layer 84 is formed with internal electrode terminals 21b, 23b, 25b, and 27b. The internal electrode terminals 21b, 23b, 25b, and 27b and the bridge conductors 73a, 73b, 75a, and 75b are simultaneously formed in the same layer from the same material.

The bridge conductors 73a, 73b, 75a, and 75b are formed in an elongated rectangular shape to extend in the horizontal direction of FIG. 2 when viewed in the normal direction of the substrate surface. The bridge conductors 73a, 73b, 75a, and 75b have a width which is substantially the same as the width w1 of the coil conductor 33. For example, the width is in the range from 10 to 30 μm. The bridge conductors 73a and 73b are disposed in the vicinity of the internal electrode terminal 21b and are arranged side by side in the vertical direction of the figure. The bridge conductors 75a and 75b are disposed in the vicinity of the internal electrode terminal 23b and are arranged side by side in the vertical direction of the figure. The bridge conductor 73a is opposite to the bridge conductor 75a, and the bridge conductor 73b is opposite to the bridge conductor 75b.

The bridge conductors 73a, 73b, 75a, and 75b are formed between the coil conductor 33 and the coil conductor 35. The bridge conductors 73a and 73b are formed so that the insulation film 7b is interposed between the coil conductor 33 and the same. The bridge conductors 75a and 75b are formed so that the insulation film 7c is interposed between the coil conductor 35 and the same.

The bridge conductor 73a is formed on the insulation film 7b in association with the inner cut portion 33a of the coil conductor 33 shown in FIG. 3. One end of the bridge conductor 73a is formed on the inner cut end 33b of the coil conductor 33 exposed at the via hole 31a, and another end of the conductor is formed on the inner cut end 33c of the coil conductor 33 exposed at the via hole 31b. Thus, the bridge conductor 73a connects the inner cut ends 33b and 33c of the coil conductor 33 to each other through the via holes 31a and 31b.

The bridge conductor 73b is formed on the insulation film 7b in association with the outer cut portion 33a of the coil conductor 33 shown in FIG. 3. One end of the bridge conductor 73b is formed on the outer cut end 33b of the coil conductor 33 exposed at the via hole 31a, and another end of the conductor is formed on the outer cut end 33c of the coil conductor 33 exposed at the via hole 31b. Thus, the bridge conductor 73b connects the outer cut ends 33b and 33c of the coil conductor 33 to each other through the via holes 31a and 31b.

The coil conductor 33 is in the form of one continuous spiral when viewed in the normal direction of the substrate surface because the two pairs of cut ends 33b and 33c are connected by the bridge conductors 73a and 73b formed in the bridge conductor layer 84 that is different from the layer in which the coil conductor is formed. One coil is constituted by the coil conductor 33 and the bridge conductors 73a and 73b.

The bridge conductors 73a and 73b are substantially orthogonal to the lead wire 29 when viewed in the normal direction of the substrate surface. The insulation film 7b is formed between the bridge conductors 73a, 73b and the lead wire 29. Thus, insulation is provided between the bridge conductors 73a, 73b and the lead wire 29 by the insulation film 7b.

Each of the ends of the bridge conductors 75a and 75b on the left side in the figure is exposed at a via hole 37a formed in the insulation film 7c. Each of the ends of the bridge conductors 75a and 75b on the right side in the figure is exposed at a via hole 37b formed in the insulation film 7c.

Figure 4:
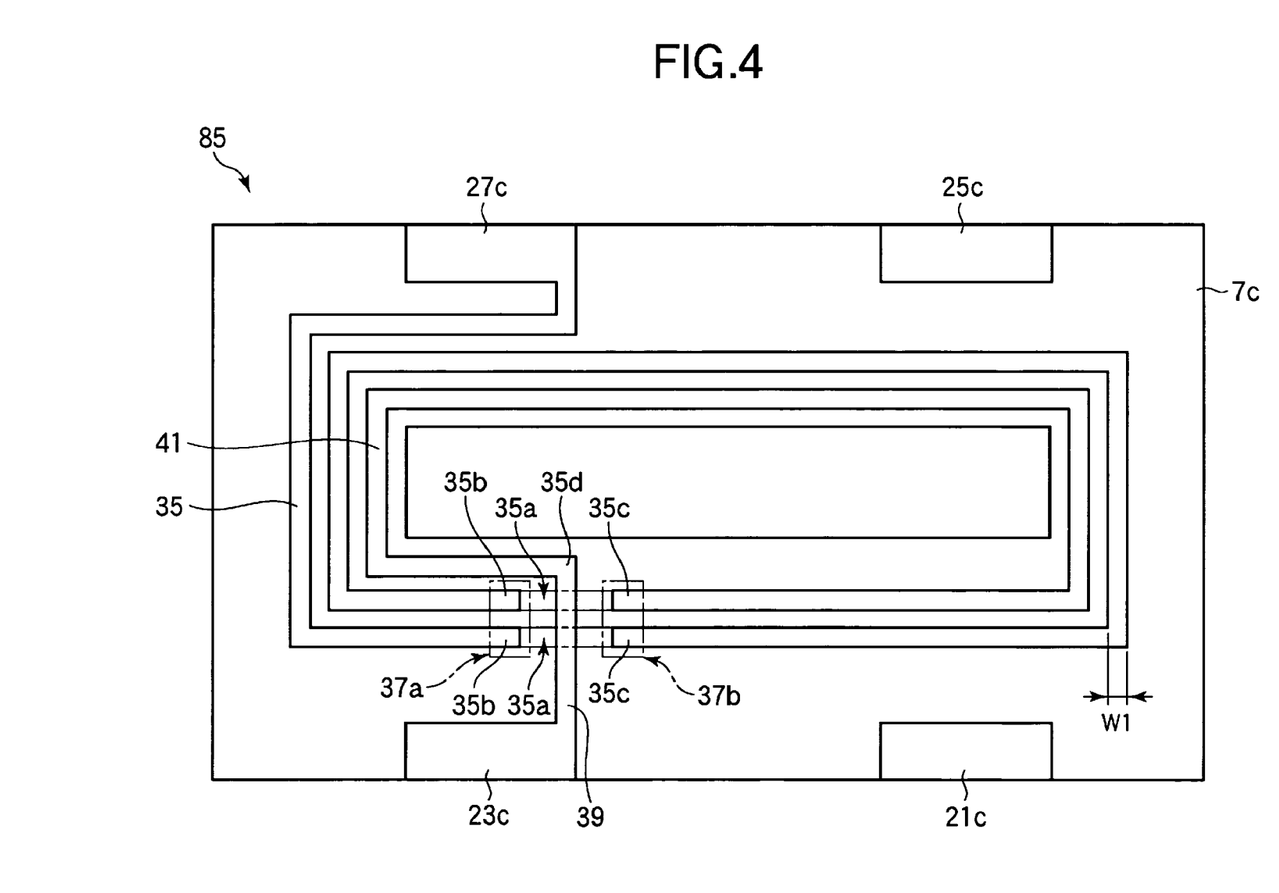
FIG. 4 shows a coil conductor layer 85 of the common mode filter 1 according to the embodiment of the invention.

FIG. 4 is a plan view of the coil conductor layer 85 taken in the normal direction of the substrate surface. In FIG. 4, an imaginary line is represented by a chain line. As shown in FIG. 4, the coil conductor layer 85 includes internal electrode terminals 21c, 23c, 25c, and 27c, a lead wire (second lead-out conductor) 39, and a coil conductor 35. The internal electrode terminals 21c, 23c, 25c, and 27c, the lead wire 39, and the coil conductor 35 are simultaneously formed in the same layer from the same material.

The coil conductor 35 extends outwardly from an inner circumferential end 35d thereof and is wound counterclockwise to make about 2.5 turns. The conductor is thus formed in a spiral shape substantially the same as that of the coil conductor 33. As shown in FIG. 2, the coil conductor 35 is disposed to face the coil conductor 33 with the insulation film 7b, the bridge conductor layer 84, and the insulation film 7c interposed between them. As shown in FIG. 4, an outer circumferential end of the coil conductor 35 is connected to the internal electrode terminal 27c. The coil conductor 35 has a width w1 which is substantially the same as the width w1 of the coil conductor 33 and which is, for example, in the range from 10 to 30 μm. The coil conductor 35 is partially cut in one location of each turn thereof or in two locations in total in the vicinity of the inner circumferential end 35d. Thus, the conductor has a cut portion 35a formed on each turn thereof. The two cut portions 35a formed at the respective turns are aligned in a line in the vertical direction of FIG. 4. The lengths of the two cut portions 35a are substantially equal to each other and substantially equal to the length of the cut portions 33a.

Cut ends 35b and 35c of each turn of the coil conductor 35 face each other with the cut portion 35a interposed between them. The two cut ends 35b are formed on the left side of the cut portions 35a in the figure. The two cut ends 35c are formed on the right side of the cut portions 35a in the figure.

The lead wire 39 is extended from the inner circumferential end 35d of the coil conductor 35 through the gap between the cut ends 35b and 35c up to the outside of the coil conductor 35. One end of the lead wire 39 is connected to the internal electrode terminal 23c. Another end of the lead wire 39 is connected to the inner circumferential end 35d of the coil conductor 35. Therefore, the inner circumferential end 35d of the coil conductor 35 is electrically connected to the internal electrode terminal 23c which is formed in the coil conductor layer 85 through the lead wire 39 formed in the coil conductor layer 85 in which the conductor is formed. Thus, no via hole for inter-layer connection between the coil conductor 35 and the lead wire is formed inside the coil conductors 33 and 35 when viewed in the normal direction of the substrate surface.

The lead wire 39 extends in the form of a straight line in the vertical direction of the figure. When viewed in the normal direction of the substrate surface, the lead wire 39 is substantially orthogonal to each of the two cut portions 35a. The lead wire 39 extends substantially in the middle of the gap between the cut ends 35b and 35c. The insulation film 7d (not shown in FIG. 4) is formed at each of the gaps between the lead wire 39 and the cut ends 35b and 35c. Thus, insulation is provided at each of the gaps between the lead wire 39 and the cut ends 35b and 35c by the insulation film 7d.

The inner cut portion 35a of the coil conductor 35 is formed on the insulation film 7c in association with the bridge conductor 75a shown in FIG. 2. The inner cut end 35b of the coil conductor 35 is formed on the end of the bridge conductor 75a, which is on the left side of the conductor in FIG. 2, exposed at the via hole 37a. The inner cut end 35c of the coil conductor 35 is formed on the end of the bridge conductor 75a, which is on the right side of the conductor in the figure, exposed at the via hole 37b. Thus, the bridge conductor 75a connects the inner cut ends 35b and 35c of the coil conductor 35 to each other through the via holes 37a and 37b.

The outer cut portion 35a of the coil conductor 35 is formed on the insulation film 7c in association with the bridge conductor 75b shown in FIG. 2. The outer cut end 35b of the coil conductor 35 is formed on the end of the bridge conductor 75b, which is on the left side of the conductor in the figure, exposed at the via hole 37a. The outer cut end 35c of the coil conductor 35 is formed on the end of the bridge conductor 75b, which is on the right side of the conductor in the figure, exposed at the via hole 37b. Thus, the bridge conductor 75b connects the outer cut ends 35b and 35c of the coil conductor 35 to each other through the via holes 37a and 37b.

The coil conductor 35 is in the form of one continuous spiral when viewed in the normal direction of the substrate surface because the two pairs of cut ends 35b and 35c are connected by the bridge conductors 75a and 75b formed in the bridge conductor layer 84 that is different from the layer in which the coil conductor is formed. One coil is constituted by the coil conductor 35 and the bridge conductors 75a and 75b.

When viewed in the normal direction of the substrate surface, the lead wire 39 is substantially orthogonal to the bridge conductors 75a and 75b. The insulation film 7c is formed between the bridge conductors 75a, 75b and the lead wire 39, and insulation is provided between the bridge conductors 75a, 75b and the lead wire 39 by the insulation film 7c.

The internal electrode terminal 21 shown in FIG. 1 is formed by stacking the internal electrode terminals 21a, 21b, and 21c in the order listed. The internal electrode terminal 23 is formed by stacking the internal electrode terminals 23a, 23b, and 23c in the order listed. The internal electrode terminal 25 is formed by stacking the internal electrode terminals 25a, 25b, and 25c in the order listed. The internal electrode terminal 27 is formed by stacking the internal electrode terminals 27a, 27b, and 27c in the order listed.

The coil conductors 33 and 35, the lead wires 29 and 39, and the bridge conductors 73a, 73b, 75a, and 75b are embedded in the insulation layer 7 (insulation films 7a, 7b, 7c, and 7d) to form one choke coil. The lead wires 29 and 39 and the bridge conductors 73a, 73b, 75a, and 75b are not exposed on side surfaces of the insulation layer 7. The external electrode 13 shown in FIG. 1 is electrically connected to the external electrode 17 through the internal electrode terminal 21, the lead wire 29, the coil conductor 33, the bridge conductors 73a and 73b, and the internal electrode terminal 25. The external electrode 15 is electrically connected to the external electrode 19 through the internal electrode terminal 23, the lead wire 39, the coil conductor 35, the bridge conductors 75a and 75b, and the internal electrode terminal 27.

The magnetic substrates 3 and 5 are formed from a magnetic material such as sintered ferrite or composite ferrite. Each of the insulation films 7a, 7b, 7c, and 7d is formed by applying a material having high insulating properties and high workability such as polyimide resin or epoxy resin and patterning the same into a predetermined shape. The coil conductors 33 and 35, the bridge conductors 73a, 73b, 75a, and 75b, the lead wires 29 and 39, and the internal electrode terminals 21, 23, 25, and 27 are provided by forming films of Cu, silver (Ag), or aluminum (Al) which have high electrical conductivity and workability and patterning the films into predetermined shapes. The insulation films 7a, 7b, 7c, and 7d and the bridge conductor layer 84 have a thickness, for example, in the range from 5 to 10 μm. Therefore, the distance between the coil conductors 33 and 35 is, for example, in the range from 15 to 30 μm. The coil conductor layers 83 and 85 have a thickness, for example, in the range from 15 to 25 μm.

Figure 5:
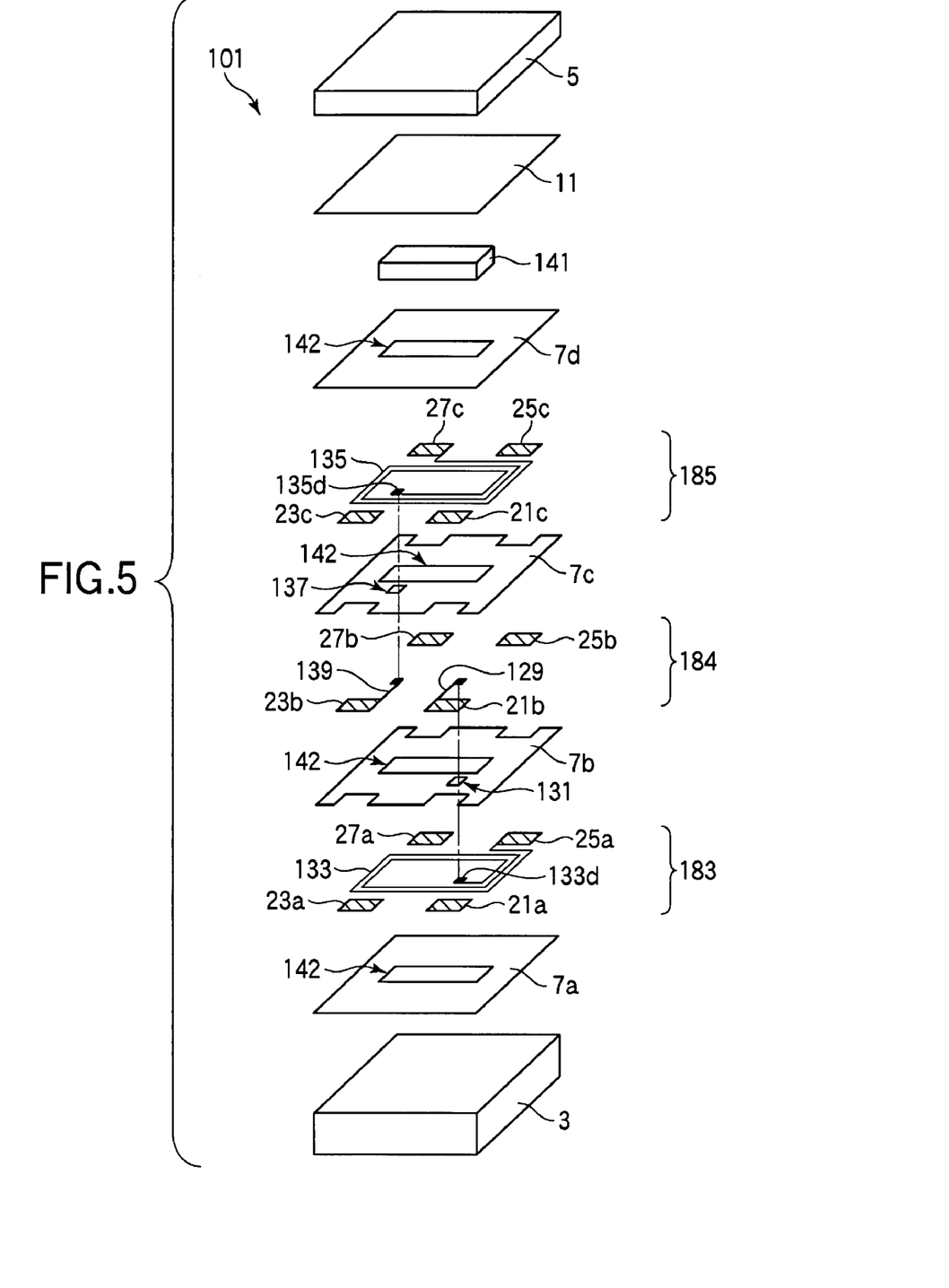
FIG. 5 is an exploded perspective view of a common mode filter 101 which is an example to be compared with the embodiment of the invention.

FIG. 5 is an exploded perspective view of a multi-layer structure of a common mode filter 101 according to the related art shown as an example to be compared with the common mode filter 1 of the present embodiment. In FIG. 5, connection between conductors formed in different layers is represented by a chain line. In FIG. 5 and subsequent drawings, elements having the same functions and effects as the elements shown in FIGS. 1 to 4 are indicated by like reference numerals and will not be described in detail.

As shown in FIG. 5, an insulation film 7a, a coil conductor layer 183, an insulation film 7b, a lead wire layer 184, an insulation film 7c, a coil conductor layer 185, an insulation film 7d, and a bonding layer 11 are stacked in the order listed between magnetic substrates 3 and 5. In the common mode filter 101, a coil conductor 133 is formed in the coil conductor layer 183 instead of the coil conductor 33, and a coil conductor 135 is formed in the coil conductor layer 185 instead of the coil conductor 35. A lead wire 129 is formed in the lead wire layer 184 instead of the lead wire 29 and the bridge conductors 73a and 73b, and a lead wire 139 is formed in the lead wire layer 184 instead of the lead wire 39 and the bridge conductors 75a and 75b. A via hole 131 is formed in the insulation film 7b instead of the via holes 31a and 31b, and a via hole 137 is formed in the insulation film 7c instead of the via holes 37a and 37b. Openings 142 are formed in the insulation films 7a, 7b, 7c, and 7d instead of the openings 42, and a magnetic layer 141 is formed instead of the magnetic layer 41.

Figure 6:
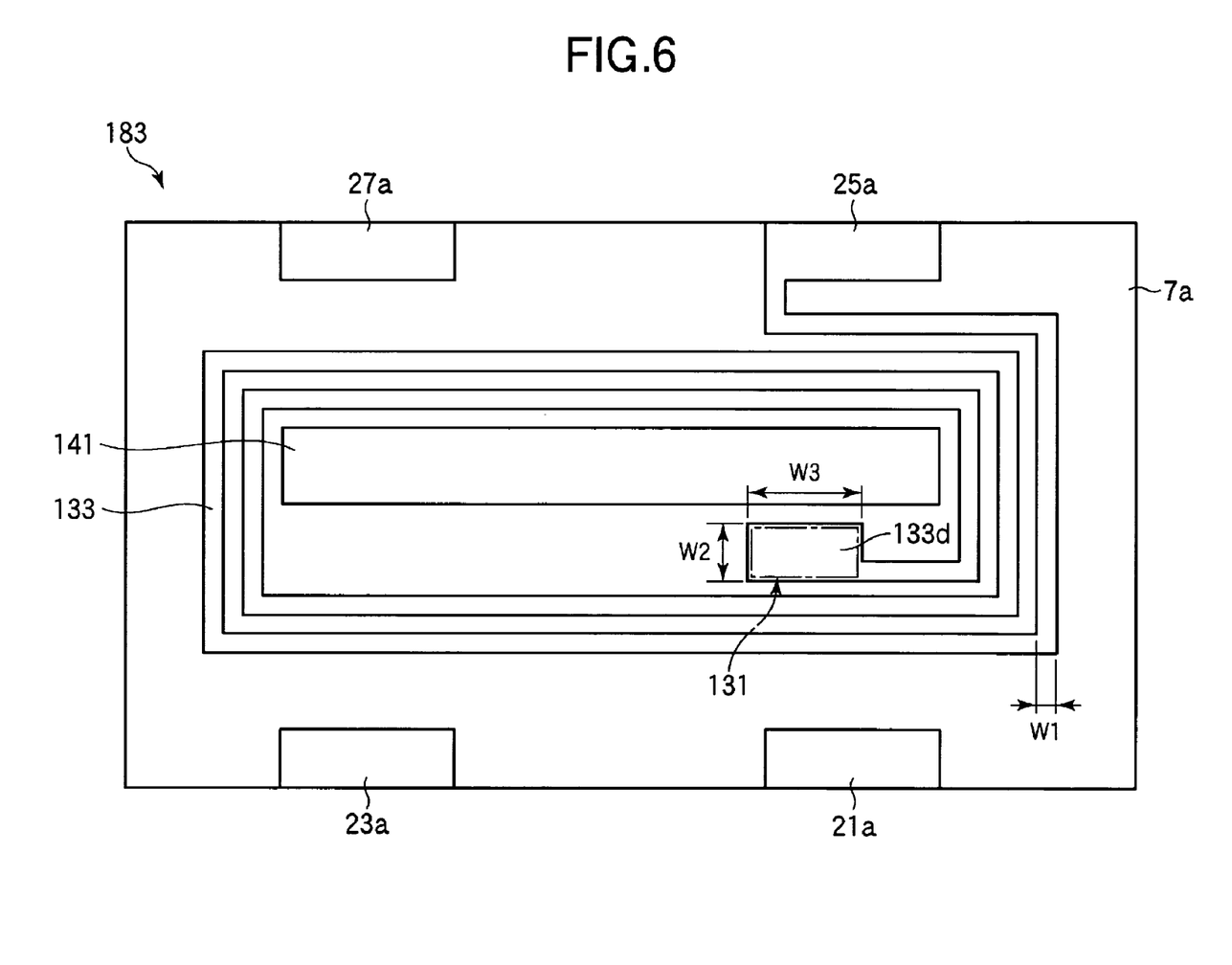
FIG. 6 shows a coil conductor layer 183 of the common mode filter 101 which is an example to be compared with the embodiment of the invention.

FIG. 6 is a plan view of the coil conductor layer 183 taken in the normal direction of the substrate surface. In FIG. 6, an imaginary line is represented by a chain line. As shown in FIGS. 5 and 6, the coil conductor layer 183 includes internal electrode terminals 21a, 23a, 25a, and 27a and the coil conductor 133.

The coil conductor 133 is formed like one continuous spiral unlike the coil conductor 33, and the coil conductor 133 has no cut portion. An outer circumferential end of the coil conductor 133 is connected to the internal electrode terminal 25a. The coil conductor 133 has a width w1 which is substantially equal to the width w1 of the coil conductor 33 and which is, for example, in the range from 10 to 30 μm.

An inner circumferential end 133d of the coil conductor 133 is exposed at the via hole 131 formed in the insulation film 7b (not shown in FIG. 6). When viewed in the normal direction of the substrate surface, the via hole 131 is formed in a rectangular shape. The inner circumferential end 133d of the coil conductor 133 is formed with substantially the same shape as that of the via hole 131 when viewed in the normal direction of the substrate surface. The via hole 131 is formed so as to occupy an area of, for example, 1500 μm$^2$ or more when viewed in the normal direction of the substrate surface, the dimension being chosen for the purpose of improving the reliability of connection between the coil conductor 133 and the lead wire 129 which will be described later and in consideration to the resolution of photosensitive resin used as the insulation film 7b in which the via hole 131 is formed. Thus, a width w2 of the via hole 131 and the inner circumferential end 133d in the vertical direction of FIG. 6 (vertical width) is greater than the width w1 of the coil conductor 133. Therefore, the via hole 131 and the inner circumferential end 133d are formed to protrude inside the coil conductor 133. For example, the vertical width w2 of the via hole 131 and the inner circumferential end 133d is 30 μm or more, and a width w3 of those elements in the horizontal direction of the figure (horizontal width) is 50 μm or more.

Referring to FIG. 5 again, the lead wire layer 184 includes internal electrode terminals 21b, 23b, 25b, and 27b and lead wires 129 and 139. The lead wires 129 and 139 are formed in an elongated rectangular shape, and they extend in the vertical direction of FIG. 5. One end of the lead wire 129 is connected to the internal electrode terminal 21b. Another end of the lead wire 129 is connected to the inner circumferential end 133d of the coil conductor 133 through the via hole 131. Therefore, the inner circumferential end 133d of the coil conductor 133 is electrically connected to the internal electrode terminal 21b, which is in a different layer, through the lead wire 129 formed in the lead wire layer 184 which is also a different layer. When viewed in the normal direction of the substrate surface, the lead wire 129 extends across the coil conductor 133 with the insulation film 7b interposed between them. One end of the lead wire 139 is connected to the internal electrode terminal 23b, and another end of the lead wire 139 is exposed at the via hole 137 formed in the insulation film 7c.

The coil conductor layer 185 includes internal electrode terminals 21c, 23c, 25c, and 27c and the coil conductor 135.

An outer circumferential end of the coil conductor 135 is connected to the internal electrode terminal 27c. An inner circumferential end 135d of the coil conductor 135 is connected to the other end of the lead wire 139 through the via hole 137. Therefore, the coil conductor 135 is electrically connected to the internal electrode terminal 23b, which is in a different layer, through the lead wire 139 formed in the lead wire layer 184 which is also a different layer. When viewed in the normal direction of the substrate surface, the lead wire 139 extends across the coil conductor 135 with the insulation film 7c interposed between them.

The shapes of the coil conductor 135, the inner circumferential end 135d of the coil conductor 135, and the via hole 137 and positional relationships between those elements are not described in detail because the shapes and positional relationships are similar to those of the coil conductor 133, the inner circumferential end 133d of the coil conductor 133, and the via hole 131.

As shown in FIGS. 5 and 6, the via hole 131, the inner circumferential end 133d of the coil conductor 133, the via hole 137, and the inner circumferential end 135d of the coil conductor 135 are formed to protrude inside the coil conductors 133 and 135. Therefore, in the common mode filter 101, connecting regions for inter-layer connection between the coil conductor 133 and the lead wire 129 and between the coil conductor 135 and the lead wire 139 must be provided inside the coil conductors 133 and 135 when viewed in the normal direction of the substrate surface in addition to the regions where the coil conductors 133 and 135 are formed and the region where the magnetic layer 141 is formed.

As shown in FIGS. 3 and 4, in the case of the common mode filter 1, no inter-layer connection of conductors is made inside the coil conductors 33 and 35, and no via hole is therefore formed inside the coil conductors 33 and 35. Thus, unlike the common mode filter 101, it is not required to provide connection regions for inter-layer connection of conductors in the common mode filter 1 separately from the regions for forming the coil conductors 33 and 35 and the magnetic layer 41. Therefore, as shown in FIGS. 3 and 6, the magnetic layer 41 of the common mode filter 1 can be formed to occupy a greater area than that in the common mode filter 101 when viewed in the normal direction of the substrate surface. The common mode filter 1 of the present embodiment can therefore provide higher impedance compared to the common mode filter 101. Thus, the present embodiment makes it possible to provide a common mode filter 1 which is excellent in electrical characteristics such as impedance characteristics. A common mode filter having high electrical characteristics can be also provided by increasing the number of turns of the coil conductors 33 and 35 instead of increasing the area of the magnetic layer 41.

Table 1 shows results of a simulation and analysis made on the areas of the magnetic layer 41 of the common mode filter 1 and the magnetic layer 141 of the common mode filter 101 and the inductance of the common mode filters 1 and 101.

TABLE 1

|  | Magnetic Layer Surface Area (μm$^2$) | Inductance (nH) |
| --- | --- | --- |
| Common Mode Filter 101 | 49190 | 94 |
| Common Mode filter 1 | 67750 | 103 |
| Ratio | 1.3773 | 1.0957 |
| Rate of Increase | 38% | 9.6% |

As shown in Table 1, the surface area of the magnetic layer 141 of the common mode filter 101 is 49190 (μm$^2$). The surface area of the magnetic layer 141 of the common mode filter 1 is 67750 ($\mu m^2$). Therefore, the ratio of the surface area of the magnetic layer 41 to the surface area of the magnetic layer 141 is 1.3773. In the common mode filter 1, the magnetic layer has a surface area that is 38% greater than that in the common mode filter 101.

The common mode filter 101 has inductance of 94 (nH). The common mode filter 1 has inductance of 103 (nH). Therefore, the ratio of the inductance of the common mode filter 1 to that of the common mode filter 101 is 1.0957. The inductance of the common mode filter 1 is 9.6% greater than that of the common mode filter 101.

A description will now be made using FIG. 2 on a method of manufacturing a coil component according to the present embodiment with reference to the common mode filter 1 by way of example. A multiplicity of common mode filters 1 are simultaneously formed on a wafer, but FIG. 2 shows an exploded perspective view of a single common mode filter 1 to show the multi-layer structure of the same.

First, as shown in FIG. 2, polyimide resin is applied to the top of a magnetic substrate 3 to form an insulation film 7a having a thickness in the range from 5 to 10 $\mu$m. The insulation film 7a is formed using a spin coat process, a dipping process, a spray process, or a printing process. Then, the insulation film 7a is exposed, developed, and patterned. Thus, an opening 42 is formed in the insulation film 7a. The insulation film 7a is then cured. Each of insulation films 7b, 7c, and 7d to be described later is formed using a similar process.

Next, a metal layer such as a Cu layer (not shown) is formed throughout the resultant surface using a vacuum film forming process (such as evaporation or sputtering) or a plating process. Although what is required for the electrode film is that it is formed from a conductive material, it is desirable to use the same material as the material for forming plating films to be described later. A bonding layer such as a Cr (chromium) film or Ti (titanium) film may be formed under the electrode film, the bonding layer serving as a buffer film for improving adhesion between the insulation film 7a and the electrode film.

Next, a resist is applied throughout the resultant surface to form a resist layer, and a pre-baking process is performed on the resist layer as occasion demands. Exposure is then carried out on the resist layer by irradiating the resist layer with exposure light through a mask having patterns drawn thereon representing internal electrode terminals 21a, 23a, 25a, and 27a, a lead wire 29, and a coil conductor 33 having cut ends 33b and 33c. After performing a heating process as occasion demands, the resist layer is developed using an alkaline developer. For example, Tetra-Methyl-Ammonium-Hydroxide (TMAH) having a predetermined concentration may be used as the alkaline developer.

The process then proceeds from the developing step to a cleaning step. The developer in the resist layer is cleaned away with a cleaning liquid to stop the developing and dissolving reactions of the resist layer. As a result, the resist layer is patterned in a predetermined shape to form a resist frame. For example, pure water is used as the cleaning liquid. When the cleaning is completed, the substrate is dried by shaking the same to remove the cleaning liquid. If necessary, the magnetic substrate 3 may be heated such that the cleaning liquid will dry up.

Next, the magnetic substrate 3 is immersed in a plating liquid in a plating bath to perform a plating process using the resist frame as a die, and plating films of Cu are thereby formed in gaps of the resist frame. The magnetic substrate 3 is then washed and dried as occasion demands, and the resist frame is removed from the insulation film 7a using an organic solvent. Then, dry etching (such as ion milling or reactive ion etching (RIE)) or wet etching is performed using the plating films as a mask to remove the electrode film which has been exposed as a result of the removal of the resist layer.

Thus, electrode films and plating films are stacked to form internal electrode terminals 21a, 23a, 25a, and 27a, a lead wire 29, and a coil conductor 33 having cut ends 33b and 33c. Through the above-described steps, a coil conductor layer 83 is formed, the layer including the internal electrode terminals 21a, 23a, 25a, and 27a, the lead wire 29, the coil conductor 33, and the cut ends 33b and 33c which are parts of the coil conductor 33 facing each other obtained by cutting the conductor. For example, the coil conductor layer 83 is formed with a thickness in the range from 15 to 25 $\mu$m. A bridge conductor layer 84 and a coil conductor layer 85, which will be described layer, are formed in the same manner as the coil conductor 83.

Next, polyimide resin is applied throughput the resultant surface to form an insulation film 7b having a thickness in the range from 5 to 10 $\mu$m. The insulation film 7b is then exposed, developed, and patterned. As a result, the insulation film 7b is formed with a via hole 31a at which the cut ends 33b (not shown in FIG. 2) of the coil conductor 33 is exposed, a via hole 31b at which the cut ends 33c (not shown in FIG. 2) is exposed, an opening 42, and openings at which the internal electrode terminals 21a, 23a, 25a, and 27a are exposed. The insulation film 7b is then cured.

Next, a metal layer such as a Cu layer (not shown) is formed throughout the resultant surface using a vacuum film forming process (such as evaporation or sputtering) or a plating process. Next, a resist is applied throughout the resultant surface to form a resist layer, and a pre-baking process is performed on the resist layer as occasion demands. Exposure is then carried out on the resist layer by irradiating the resist layer with exposure light through a mask having patterns drawn thereon representing internal electrode terminals 21b, 23b, 25b, and 27b and bridge conductors 73a, 73b, 75a, and 75b. After performing a heating process as occasion demands, the resist layer is developed using an alkaline developer. Then, a cleaning step similar to that involved in the step of forming the coil conductor layer 83 is performed. As a result, the resist layer is patterned in a predetermined shape to form a resist frame.

Next, the magnetic substrate 3 is immersed in a plating liquid in a plating bath to perform a plating process using the resist frame as a die, and plating films of Cu are thereby formed in gaps of the resist frame. The magnetic substrate 3 is then washed and dried as occasion demands, and the resist frame is removed from the insulation film 7b using an organic solvent. Then, dry etching (such as ion milling or reactive ion etching (RIE)) or wet etching is performed using the plating films as a mask to remove the electrode film which has been exposed as a result of the removal of the resist layer.

Thus, electrode films and plating films are stacked to form internal electrode terminals 21b, 23b, 25b, and 27b and bridge conductors 73a, 73b, 75a, and 75b. The internal electrode terminals 21b, 23b, 25b, and 27b are formed on the internal electrode terminals 21a, 23a, 25a, and 27a, respectively. Ends of the bridge conductors 73a and 73b are connected to the different cut ends 33b, respectively, through the via hole 31a. Other ends of the conductors are connected to the different cut ends 33c, respectively, through the via hole 31b. Through the above-described steps, a bridge conductor layer 84 constituted by the internal electrode terminals 21b, 23b, 25b, and 27b and the bridge conductors 73a, 73b, 75a, and 75b is formed. For example, the bridge conductor layer 84 is formed with a thickness in the range from 5 to 10 $\mu$m.

Next, polyimide resin is applied throughput the resultant surface to form an insulation film 7c having a thickness in the range from 5 to 10 μm. The insulation film 7c is then exposed, developed, and patterned. As a result, the insulation film 7c is formed with a via hole 37a at which one end of each of the bridge conductors 75a and 75b is exposed and a via hole 37b at which another end of each of the conductors is exposed, an opening 42, and openings at which the internal electrode terminals 21b, 23b, 25b, and 27b are exposed. The insulation film 7c is then cured.

Next, a metal layer such as a Cu layer (not shown) is formed throughout the resultant surface using a vacuum film forming process (such as evaporation or sputtering) or a plating process. Next, a resist is applied throughout the resultant surface to form a resist layer, and a pre-baking process is performed on the resist layer as occasion demands. Exposure is then carried out on the resist layer by irradiating the resist layer with exposure light through a mask having patterns drawn thereon representing internal electrode terminals 21c, 23c, 25c, and 27c, a lead wire 39, and a coil conductor 35 having cut ends 35b and 35c. After performing a heating process as occasion demands, the resist layer is developed using an alkaline developer. Then, a cleaning step similar to that involved in the step of forming the coil conductor layer 83 is performed. As a result, the resist layer is patterned in a predetermined shape to form a resist frame.

Next, the magnetic substrate 3 is immersed in a plating liquid in a plating bath to perform a plating process using the resist frame as a die, and plating films of Cu are thereby formed in gaps of the resist frame. The magnetic substrate 3 is then washed and dried as occasion demands, and the resist frame is removed from the insulation film 7c using an organic solvent. Then, dry etching (such as ion milling or reactive ion etching (RIE)) or wet etching is performed using the plating films as a mask to remove the electrode film which has been exposed as a result of the removal of the resist layer.

Thus, electrode films and plating films are stacked to form internal electrode terminals 21c, 23c, 25c, and 27c, a lead wire 39, and a coil conductor 35 having cut ends 35b and 35c. The internal electrode terminals 21c, 23c, 25c, and 27c are formed on the internal electrode terminals 21b, 23b, 25b, and 27b, respectively. Each of the cut ends 35b (not shown in FIG. 2) of the coil conductor 35 is connected to one end of the bridge conductor 75a or the bridge conductor 75b through the via hole 37a. Each of the cut ends 35c (not shown in FIG. 2) is connected to another end of the bridge conductor 75a or the bridge conductor 75b through the via hole 37b. Through the above-described steps, a coil conductor layer 85 is formed, the layer including the internal electrode terminals 21c, 23c, 25c, and 27c, the lead wire 39, the coil conductor 35, and the cut ends 35b and 35c which are parts of the coil conductor 35 facing each other obtained by cutting the conductor. For example, the coil conductor layer 85 is formed with a thickness in the range from 15 to 25 μm. Internal electrode terminals 21, 23, 25, and 27 are also formed through the above-described steps.

Next, polyimide resin is applied throughout the resultant surface to form an insulation film 7d having a thickness in the range from 5 to 10 μm. The insulation film 7d is then exposed, developed, and patterned. An opening 42 is thus formed in the insulation film 7d. Then, the insulation film 7d is cured.

Next, the opening 42 formed in each of the insulation films 7a, 7b, 7c, and 7d is filled with composite ferrite obtained by mixing magnetic particles made of ferrite in a resin to form a magnetic layer 41 in the openings 42. An adhesive is then applied on the insulation film 7d and the magnetic layer 41 to form a bonding layer 11. A magnetic substrate 5 is then secured on the bonding layer 11.

The wafer is then cut and separated into individual common mode filters 1 in the form of chips. As a result, the internal electrode terminals 21, 23, 25, and 27 are exposed on cut surfaces of a common mode filter 1. The common mode filter 1 is then polished to chamfer corners thereof.

Although not shown, backing metal films having the same shape as that of external electrodes 13, 15, 17, and 19 are formed on the internal electrode terminals 21, 23, 25, and 27 of the common mode filter 1. The backing metal films are provided by forming a combination of a chromium (Cr) film and a Cu film or a combination of a titanium (Ti) film and a Cu film continuously using a masked sputtering process.

Next, external electrodes 13, 15, 17, and 19 having a double-layer structure made of nickel (Ni) and tin (Sn) are formed on the surface of the backing metal films using electroplating to complete the common mode filter 1 shown in FIG. 1.

As described above, according to the present embodiment, a common mode filter 1 can be manufactured using the same manufacturing method as that for common mode filters according to the related art, and there is no increase in the number of manufacturing steps compared to the methods of manufacturing common mode filters according to the related art. The present embodiment therefore makes it possible to provide a common mode filter 1 which is excellent in electrical characteristics such as impedance characteristics without increasing the manufacturing cost.

In the present embodiment, the bridge conductors 73a and 73b connecting the cut ends 33b and 33c of the coil conductor 33 to each other and the bridge conductors 75a and 75b connecting the cut ends 35b and 35c of the coil conductor 35 to each other are formed in the same layer or the bridge conductor layer 84. The method of manufacturing a common mode filter 1 according to the present embodiment allows the number of steps for forming the conductor layers and the number of steps for forming the insulation films to be reduced by one each when compared to the common mode filter disclosed in Patent document 2. Therefore, the common mode filter 1 can be manufactured at a lower cost when compared to the common mode filter disclosed in Patent Document 2.

(Modifications)

Figure 7:
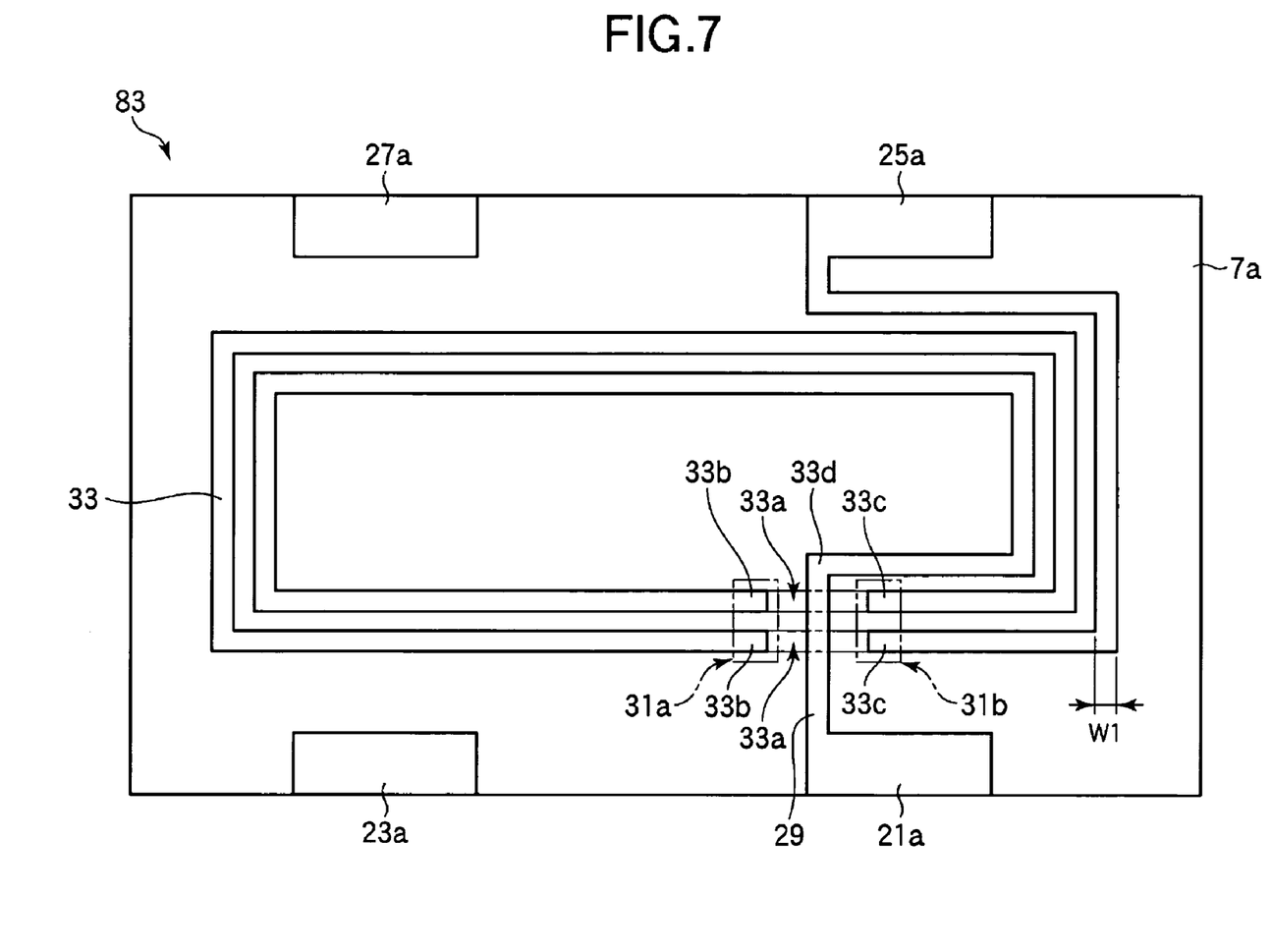
FIG. 7 shows a coil conductor layer 83 of a common mode filter which is a modification of the embodiment of the invention.

A common mode filter that is a modification of the embodiment will now be described with reference to FIG. 7. FIG. 7 is a plan view of a coil conductor layer 83 of the common mode filter of the present modification taken in the normal direction of a substrate surface. As shown in FIG. 7, the common mode filter of the present modification is different from the common mode filter 1 in that the magnetic layer 41 and the openings 42 are not formed inside the coil conductors 33 and 35.

As shown in FIGS. 6 and 7, in the common mode filter of the present modification, the area inside the coil conductors 33 and 35 can be made greater than that in the common mode filter 101. Thus, the common mode filter of the present modification can provide greater inductance because magnetic flux can pass inside the coil conductors 33 and 35 more easily.

The invention is not limited to the above-described embodiment and may be modified in various ways.

Although a common mode filter 1 having a pair of coil conductors 33 and 35 disposed opposite to each other has been explained by way of example in the above description of the embodiment, the invention is not limited to such a configuration. For example, the invention may be applied to a common mode filer array having two pairs of coil conductors in which each of coil conductors 33 and 35 is accompanied by one coil conductor provided side by side. Further, one or more additional coil conductors may be provided between the two pairs of coil conductors arranged side by side. Such common mode filter arrays provide the same advantages as those of the above-described embodiment.

Although a common mode filter 1 has been described as an example of a coil component according to the embodiment, the invention is not limited to the same and may be applied to other types of common mode filters. For example, the invention may be applied to a common mode filter in which bridge conductors 73a and 73b are formed under a coil conductor layer 83 with an insulation film interposed and in which bridge conductors 75a and 75b are formed above a coil conductor layer 85 with an insulation film interposed. This common mode filter is similar to the common mode filter 1 in that no via hole is formed inside coil conductors 33 and 35 and in that there is no need for providing connection regions for inter-layer connection of conductors inside the coil conductors 33 and 35. Therefore, a magnetic layer 41 of the common mode filter can occupy a great area when viewed in the normal direction of a substrate surface. It is therefore possible to provide a common mode filter having high electrical characteristics.

Although a common mode filter 1 has been described as an example of a coil component according to the embodiment, the invention is not limited to the same and may be applied to inductors. For example, the method of manufacturing a common mode filter 1 according to the embodiment may be changed to omit the formation of the external electrodes 15 and 19, the internal electrode terminals 23 and 27, and the bridge conductors 75a and 75b and to omit the step of forming the insulation film 7c and the coil conductor layer 85. As a result, an inductor employing a magnetic layer 41 as a core can be manufactured. The inductor is similar to the common mode filter 1 in that no via hole is formed inside coil conductor 33 and in that there is no need for providing connection regions for inter-layer connection of conductors inside the coil conductor 33. Therefore, the magnetic layer 41 of the inductor can occupy a great area when viewed in the normal direction of a substrate surface. It is therefore possible to provide an inductor having high electrical characteristics. Further, the invention may be applied to transformers.

The number of turns of the coil conductors 33 and 35 is not limited to the number of turns described in the above embodiment. The shape of the coil conductors 33 and 35 is not limited to the shape described in the above embodiment, and any spiral shape having cut portions 33a and 35a may be employed. The positions of the cut portions 33a and 35a are not limited to the positions described in the above embodiment, and what is required for the cut portions 33a and 35a is that they are formed so as to allow the lead wires 29 and 39 to be extended from the inner circumferential ends 33d and 35d of the coil conductors 33 and 35 up to the outside of the coil conductors 33 and 35.

What is claimed is:

1. A coil component comprising:
    a first coil conductor formed in a spiral shape;
    first cut ends which are parts of the first coil conductor cut to face each other; and
    a first connecting conductor formed so that an insulation film is interposed between the first coil conductor and the first connecting conductor to connect the first cut ends to each other, and so that the first coil conductor is in a form of one continuous spiral.

2. The coil component according to claim 1, wherein a width of an inner circumferential end of the first coil conductor is equal to or smaller than a width of the first coil conductor.

3. The coil component according to claim 1, further comprising a first lead-out electrode formed in the same layer as the first coil conductor formed therein and extend from the inner circumferential end of the first coil conductor through a gap between the first cut ends up to the outside of the first coil conductor.

4. The coil component according to claim 3, wherein the first lead-out conductor extends in the form of a straight line.

5. The coil component according to claim 1, further comprising a magnetic layer formed inside the first coil conductor.

6. The coil component according to claim 1, further comprising:
    a second coil conductor formed in a spiral shape and disposed opposite to the first coil conductor;
    second cut ends which are parts of the second coil conductor cut to face each other; and
    a second connecting conductor formed so that an insulation film is interposed between the second coil conductor and the second connecting conductor to connect the second cut ends to each other, and so that the second coil conductor is in a form of one continuous spiral.

7. The coil component according to claim 6, wherein the second connecting conductor is formed in the same layer as the first connecting conductor formed therein and the first and the second connecting conductors are formed between the first and the second coil conductors.

* * * * *